United States Patent [19]
Wardwell

[11] Patent Number: 5,701,086
[45] Date of Patent: *Dec. 23, 1997

[54] CONNECTING TEST EQUIPMENT TO ADJACENT LEGS OF AN IC OR THE LIKE BY INTERDIGITATING CONDUCTIVE WEDGES WITH THE LEGS

[75] Inventor: Robert H. Wardwell, Colorado Springs, Colo.

[73] Assignee: Hewlett-Packard Company, Palo Alto, Calif.

[*] Notice: The term of this patent shall not extend beyond the expiration date of Pat. No. 5,463,324.

[21] Appl. No.: 143,005

[22] Filed: Oct. 26, 1993

[51] Int. Cl.⁶ .................................................. G01R 1/073
[52] U.S. Cl. ............................................. 324/762; 324/754
[58] Field of Search ...................................... 324/754, 755, 324/762, 760; 439/65, 68, 70, 59, 912

[56] References Cited

U.S. PATENT DOCUMENTS

| | | | |
|---|---|---|---|
| 4,682,838 | 7/1987 | Achting et al. | 439/696 |
| 4,833,404 | 5/1989 | Meyer et al. | 439/54 |
| 4,835,469 | 5/1989 | Jones et al. | 324/754 |
| 5,049,813 | 9/1991 | Van Loan et al. | 439/70 |
| 5,156,649 | 10/1992 | Compton et al. | 324/762 |
| 5,166,609 | 11/1992 | Cole et al. | 439/68 |
| 5,345,364 | 9/1994 | Biernath | 439/59 |
| 5,391,082 | 2/1995 | Airhart | 324/762 |
| 5,463,324 | 10/1995 | Wardwell et al. | 324/754 |

*Primary Examiner*—Vinh P. Nguyen
*Attorney, Agent, or Firm*—Edward L Miller

[57] ABSTRACT

A probe for making electrical connections to the legs of an already mounted integrated circuit carries rows of tapered wedges. The wedges within a row are spaced apart by an amount that corresponds to the width of the IC's legs. For n-many legs on a side of the IC there are n+1 corresponding wedges, which then have n-many intervening spaces. As the positioned probe is pressed down the spaces between the wedges receive the legs of the IC, and wedges become wedged between the IC's legs. Each wedge has left and right conductive surfaces separated by an insulator. Each leg of the IC has a wedge to its left and a wedge to its right. Within the probe the right-hand conductive surface of the wedge to the left of a leg, and the left-hand conductive surface of the wedge to the right of that leg, are electrically connected together. Thus, the probe makes electrical contact to each leg in two places. The tapered wedges are of Ni- and Au-plated BeCu separated by acrylic adhesive and Kapton. Acrylic adhesive and Kapton are also used as the spacer between wedges. The rows of wedges are cemented to a mantle. A lead frame soldered to the butt end of the wedges connects opposing surfaces of adjacent wedges and makes the interconnection between the rows of wedges and an array of pins in a pin block at the top of the probe. Sticks of coplanar wedges are made by laminating layers of material in a press. The taper of the wedge tip arises from layers of shorter length in conjunction with a shaped surface in the laminating press. N+1 sticks are laminated together with intervening spacers to form a stack from which rows of n+1 wedges may be removed.

7 Claims, 13 Drawing Sheets

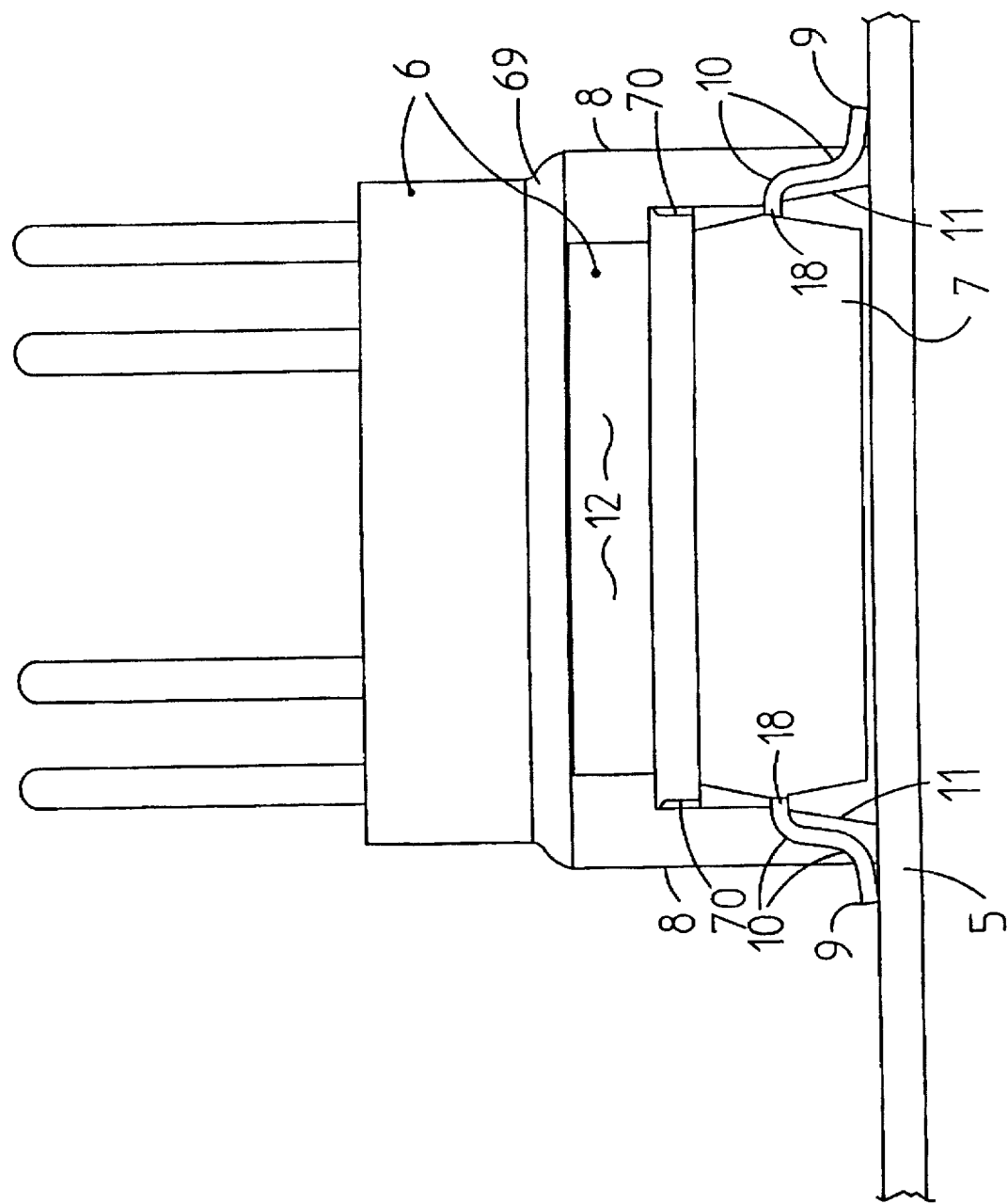

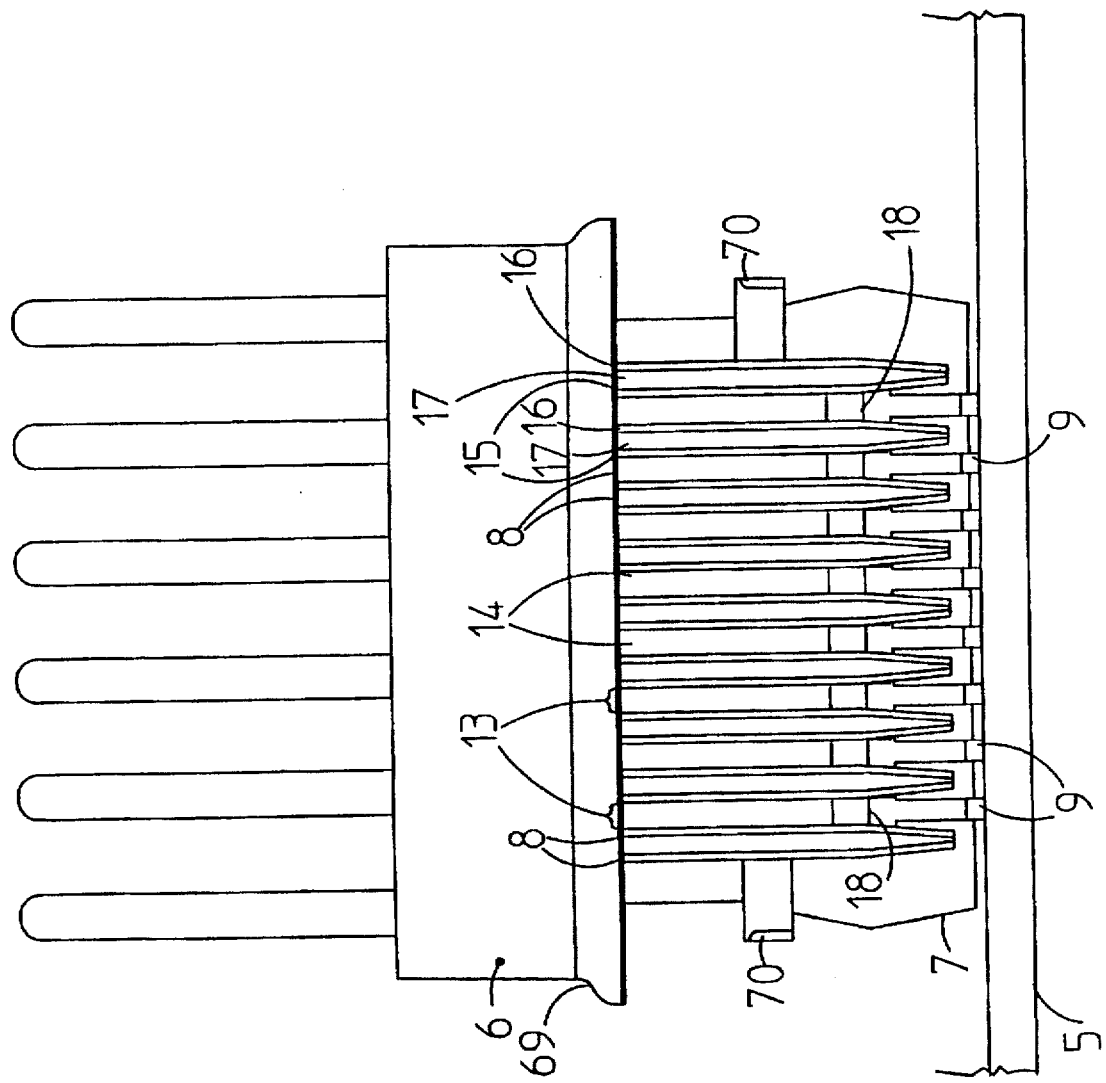

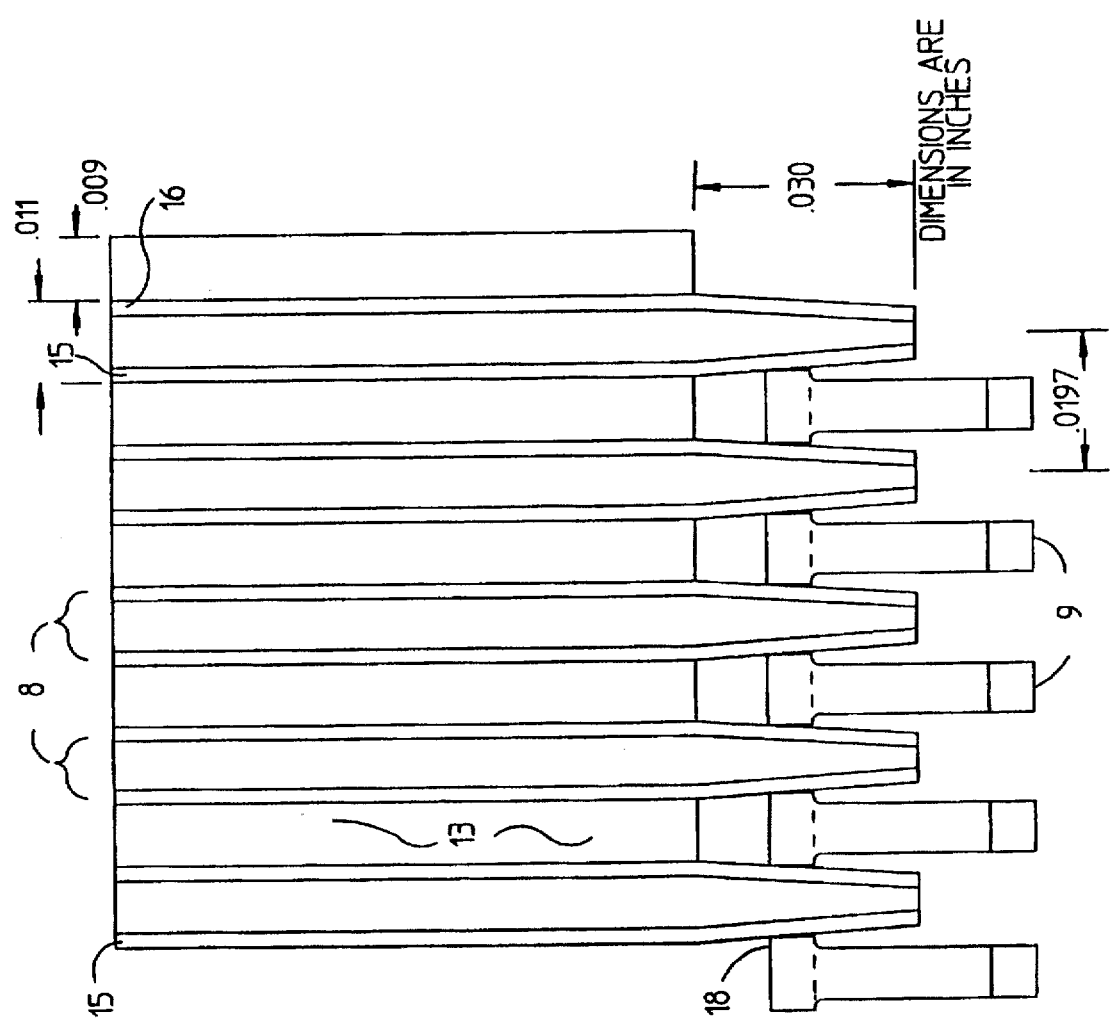

CONNECTING TEST EQUIPMENT TO ADJACENT LEGS OF AN IC OR THE LIKE BY INTERDIGITATING CONDUCTIVE WEDGES WITH THE LEGS

BACKGROUND AND SUMMARY OF THE INVENTION

The measurement of electrical signals on the leads or legs of an integrated circuit (IC) package, or the application of external electrical stimulation to the legs of an IC, has become increasingly problematic with the continued decrease in the size of the legs and the space therebetween, coupled with increasing numbers of legs on a package. The circuit probing techniques originated for use with test equipment such as voltmeters and oscilloscopes are simply impractical for use with surface mount components of half-millimeter or less lead pitch. Increasingly, the task of connecting logic analyzers, timing analyzers, emulators and automatic board testers to surface mounted integrated circuits is becoming mechanically difficult, less reliable and definitely more expensive.

As the size of the legs and their intervening space decreases, a number of problems are exacerbated. Because of the legs' smaller size, there is less contact surface, and what there is of it may be coated with a residue of solder resist or flux. Contact mechanisms that rely upon making contact with the outer face of the legs run the risk of poor contact either because of poor wiping action against the leg by the corresponding contact in the probe or because of insufficient contact pressure. Alignment is becoming increasingly critical, with the associated risk that the probe's contacts may short adjacent legs together. To ensure that the probe does not fall off inadvertently, some manufacturers are equipping their IC probes with grippers that engage the corners of the IC package. These grippers have to be replaceable because they are easily broken.

A further problem arises with conventional probes: They tend to have a bigger "footprint" than the IC's they probe, and as those IC's get smaller, the footprints do not scale down as fast in size as do those IC's. Thus, as the density of circuit boards increases so does the problem of interference between a probe for an IC and the components adjacent that IC.

What is needed is an entirely new approach for connecting to the leads of an IC. Consider wedging a strip of conductive material between adjacent legs of an IC. If one side of the material is backed by an insulator then the adjacent legs will not be shorted together. Let the wedge be flexible for movement away from one leg and toward the other, so that the wedge can adjust to slight variations in leg size or position. This allows the wedge to "follow" the gap between the legs as it is forced between them in a direction normal to the surface of the board carrying the IC. By wedging in the direction normal to the board all adjacent legs can receive a wedge at the same time. The tip of a wedge can be considerably narrower than the space between adjacent legs of the IC. This allows a group of wedges to initially interdigitate quickly with the legs of an IC, and then later begin to exert sideways pressure against the legs as the actual wedging action occurs. The wedging action is accompanied by motion and by compression of the wedge between the legs. This ensures good wiping action, and thus improves the electrical connection.

In a preferred arrangement the wedges engage the legs of the IC immediately proximate where the legs emerge from the package of the IC. At this location the legs are essentially coplanar flat strips lying in a plane parallel to and somewhat separated from the surface of the board that is to receive the IC. This is a good location, since the case provides good support for holding the legs in position, and because at this location the spacing between the legs is already closely controlled during manufacture of the IC. The regularity of spacing arises from the precision step and repeat operations undertaken to construct the die used to remove the "dam bar" that initially joins the legs during injection molding of the IC package. (The dam bar joins and aligns the legs during manufacturing operations like wire bonding to the chip, making them into a unit that is easier to handle. It also serves to prevent the plastic from extruding from between those legs during the injection molding of the package. Once the package is molded, however, the dam bar needs to be removed, since it shorts all the legs together.)

The inner edge of the wedge which comes closest to the package of the IC as the wedge penetrates between the legs can be relieved at the tapered end of the wedge. This is the lower inside corner of the wedge, as it were; the relief can be accomplished either as a radius or as a shallow triangle. The purpose of this relief is to allow the probe to fit slightly loosely over the IC as the probe is started. This will occur because the distance between opposing wedges (i.e., wedges on opposite sides but the same distance away from a common intervening side) is slightly greater at their tips than further up at where the wedging actually occurs.

It will also be appreciated that the wedges could, if so desired, be disposed so that they interdigitate with that portion of the legs that traverse the height difference between where the legs exit the package and where they are soldered to the circuit board. That is, on the (possibly straight) intervening portion between the opposing bends of the S-shape given to the legs.

Furthermore, there need be no limitation on the concept of wedging that limits it to use with high density surface mount IC's. Suitable wedges for use with older styles of IC packaging are quite feasible. Nor must it be the case that the IC be soldered to a circuit board; the shape of the wedges can be selected to function when the IC they are probing is installed in a socket that is itself mounted on a printed circuit board.

The interdigitation relied upon for producing wiping action and contact pressure assures that there will be no shorting between adjacent IC pins or legs. This is because the length and width of the conductive surface of the wedge are each at right angles to the direction in which the IC legs occur in sequence. The interdigitation also assists, perhaps in conjunction with guides engaging the corners of the IC package, in automatic self alignment of the probe with the IC.

In principle, the wedges need not attach to any structure or support larger than or located outside the outline (footprint) of the IC itself (which includes its legs). That is, the outermost extent of a probe incorporating wedges (the probe's extended footprint, as it were) can be less than, and located entirely within, the footprint of the IC. The wedges themselves can be attached to a supporting structure within the probe that is very comfortably on the inside of the footprint. This means that interference between the probe and parts closely adjacent to the IC can be avoided.

IC's with perimeter leads generally have two or four rows of legs, or at most one row along each side of the package. If a row has n legs then n wedges conductive on just one side are sufficient. With n wedges the wedge at one end of the row is in a different situation than the others, since it does not wedge between two adjacent legs. Instead, it must rely upon its own rigidity to produce sufficient contact pressure with its corresponding leg.

Further advantages may be obtained by making the wedges conductive on two sides (that are separated by an intervening insulator) and by increasing the number of wedges to n+1 so that the n intervening spaces therebetween align with the n legs. Adjacent wedges have conductive portions that face each other; these portions are electrically connected together. First, this doubles the amount of electrical contact on each leg. Second, it makes the aggregate force applied to each row of legs symmetrical, since now each leg at each end of a row is contacted by an inner-most portion of each outer-most wedge.

The individual wedges themselves may be fabricated by laminating gold plated copper foil with one or more layers of a suitable thin plastic and an adhesive. Wedges to be conductive on both sides have copper foil on both sides. The tapered portion at the tip of a wedge may be formed by giving different lengths to the interior layers of thin plastic and adhesive. Alternatively, the tip of a double sided wedge may be etched to remove some of the material separating the two outer conductive foils. A plurality of wedges may be laminated together with adhesive and plastic spacers to form rows of wedges that will interdigitate with the legs of the IC. The rows of wedges are bonded to a carrier or header, and electrical connections are made between the copper foil and the interconnecting wires or cables that are attached at their other end to whatever measurement device or test equipment that uses the probe. The result is a relatively inexpensive probe that may be readily pressed onto the IC of interest, does not interfere with surrounding components, makes good electrical contact, and that will reliably remain affixed to the IC through simple friction until removed.

BRIEF DESCRIPTION OF THE DRAWINGS

FIG. 2 is an end view of an integrated circuit package having two row of legs on the sides and being probed by a probe constructed in accordance with the principles described herein, and showing one example of the relative size and position of the tapered wedges of the probe compared to the case and legs of an IC;

FIG. 3 is a side view of the arrangement of FIG. 2, and illustrates where on the legs of a standard surface mount IC the actual wedging occurs;

FIG. 4B is an enlarged excerpt of FIG. 3;

DESCRIPTION OF A PREFERRED EMBODIMENT

Figure 1:
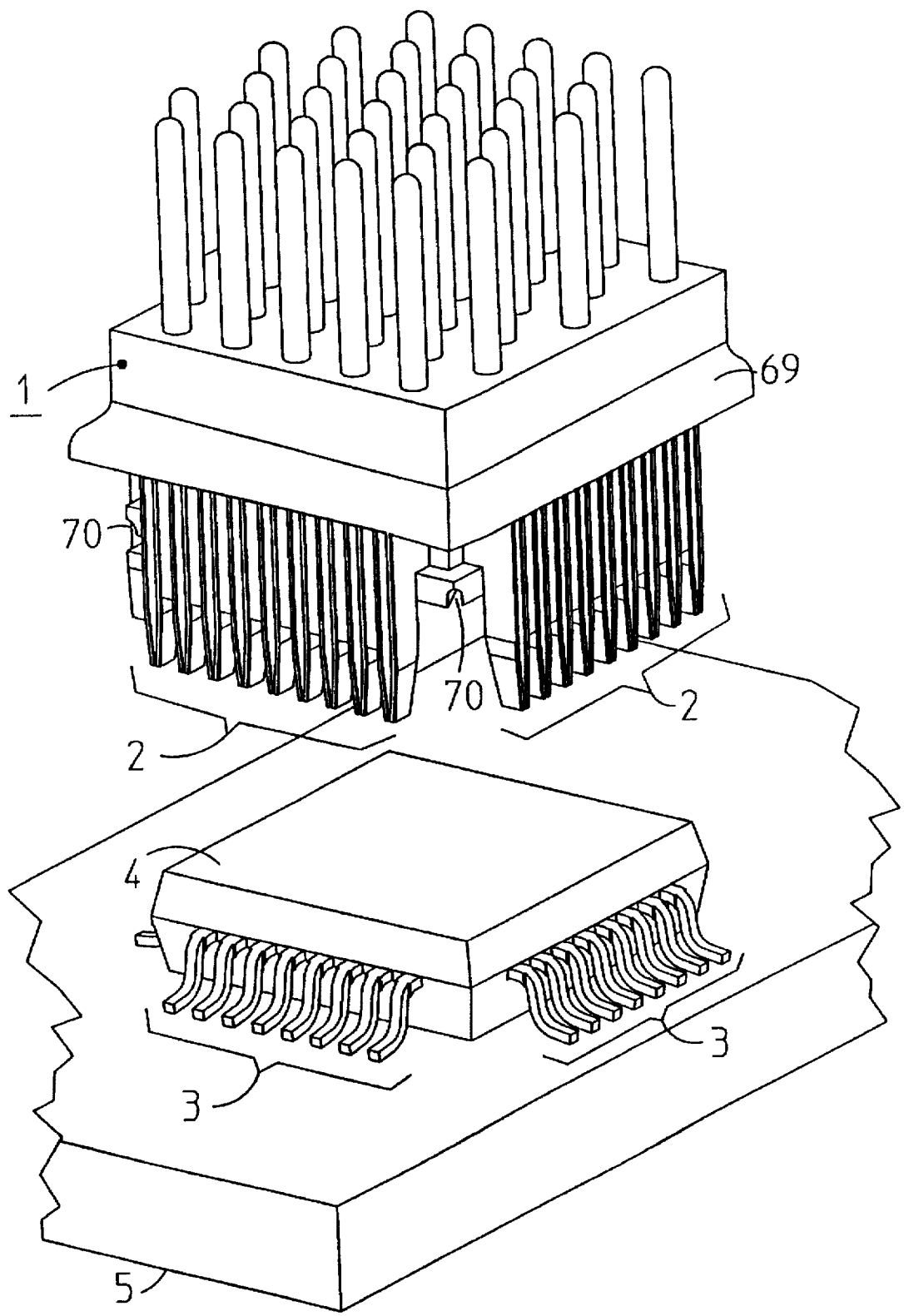
FIG. 1 is a perspective view of a probe, constructed in accordance with the principles described herein, positioned above an integrated circuit with whose legs the probe is to make electrical contact by wedging tapered double sided conductors between those legs.

Refer now to FIG. 1, wherein is shown a perspective view of a probe 1 having conductive wedges 2 that interdigitate with and wedge against the legs 3 of an integrated circuit (IC) 4. The IC 4 shown in FIG. 1 has (by way of example only) eight legs 3 on each side, for a total of thirty-two. Note that the probe 1 has nine wedges 2 on each side, for a total of thirty-six. For each side of the probe 1, then, there are eight interior spaces between the nine wedges 2 of that side. As the probe 1 is brought down over the IC 4 and aligned therewith, the eight spaces within each side of wedges 2 will be directly above the legs 3 of the corresponding side of the IC 4. That is, each leg will have a wedge positioned to its left and right, including the left-most and right-most legs of each side.

Thus, as the probe 1 is brought closer to the IC 4 the legs 3 interdigitate with the wedges 2, such that each leg 3 is in mechanical contact on its left-hand side with the right-hand side of the wedge 2 to its left and also on its right-hand side with the left-hand side of the wedge 2 to its right. The wedges 2 are distinctly tapered at their distal ends, where they first encounter the legs 3 of the IC 4. This is to facilitate alignment. Above the initial taper of their distal ends the outer surfaces of the wedges 2 gradually transition to being parallel to permit a gradual wedging action to occur as the probe 1 is moved closer to the IC 4. This wedging occurs because there is point on each wedge 2 where its thickness exceeds the space between adjacent legs 3 into which the wedge 2 is proceeding.

Naturally, it would be unrealistic to expect that all wedges 2 and legs 3 engage with perfect uniformity as the probe 1 is brought into contact with the IC 4. There must be some degree of compliance in the elements to allow for a lack of ideal uniformity in the size, shape and spacing of the legs 3 and wedges 4. Sources of this compliance include elasticity of the wedges 2 themselves, flexibility of the wedges 2 so that they can bend slightly and realign their path of motion to proceed into an out-of-position space between adjacent legs 3, and to a lesser extent, flexibility and elasticity of the legs 3.

Each wedge 2 has separate left and right conductive surfaces, which may be of nickel-then-gold plated beryllium copper foil; these conductive surfaces are internally separated by an insulating material and adhesive. Within the probe 1 the facing conductive surfaces of adjacent wedges 2 are electrically connected together (how this is done is explained later). That is, on each side, and for all except the left-most side of the left-most wedge and the right-most side of the right-most wedge: the right-hand side of a wedge on the left and the left-hand side of an adjacent wedge on the immediate right are electrically connected together. Thus, the mechanical contact produced by the wedging action also produces two locations of electrical contact upon each leg 3, including the end-most legs of the rows of legs 3 on each side of the IC 4. These two locations on each leg are on its left and right sides.

That there are two locations of contact on each leg is a useful advantage: it not only reduces electrical contact resistance to the leg, but also reduces somewhat the series inductance of the wedge. Furthermore, it provides redundancy of connection, so that if for some reason (mechanical misalignment or surface contamination) one of a pair of adjacent wedges does not make contact with the intervening leg, then there is still a good chance that the other wedge will make contact.

FIG. 2 depicts a side view of a probe 6 mounted to an IC 7. The objects depicted are similar to those shown in FIG. 1, with the difference being that the IC 7 has eight legs on each of two opposing sides and no legs on either of the remaining intervening two sides. The probe 6 matches that configuration. This particular configuration was selected for purposes of clarity in illustration; it is immaterial whether or not there actually is an IC with that particular configuration. And if there is, it is clear that, absent some special reason to the contrary, either the corresponding probe 6 or the four sided eight-legs-per-side probe 1 of FIG. 1 could be used to probe IC 7.

It will be appreciated that in FIG. 2 visible wedges 8 are nearest the viewer's eye among several hidden wedges 8 along two parallel axes projecting into the figure. Likewise, visible legs 9 are the nearest among several hidden legs along those same axes. Visible legs 9 are nearer the eye than visible wedges 8; each of wedges 8 is wedged between an associated leg 9 and the next leg inward (not visible) along the axis projecting into the figure. Also, the wedges 8 are shown as adjacent a carrier or chassis portion 12 (of probe 6) whose function is to support the wedges 8 and anchor them in fixed positions relative to another. More will be said about support and anchoring in due course.

For the present, then, FIG. 2 shows that when the wedges 8 are in use they are generally close against the body of the IC 7, and it illustrates the extent to which the width of the wedges adds to the overall breadth of the probe 6. As can be seen in the figure, that extra width (per side) is approximately the distance used by the legs 9 and their "S curve" as they transition from their point of exit on the IC 7 to where they begin to contact the circuit board 5. Also visible is how the wedges 8 have been relieved by the removal of a shallow triangular portion whose hypotenuse was located at the position indicated by 11.

Refer now to FIG. 3, wherein is shown an enlarged side view of the right-hand edge of the end view in FIG. 2. In this view the row of wedges 8 is visible as nine adjacent wedges 8. There are eight intervening spaces 13 between the nine wedges. Each space 13 corresponds to one of the eight legs 9 of the IC 7. The interdigitation occurs as the legs enter their corresponding space. The spaces 13 are created by the presence of spacers 14 that are in permanent alternation with the wedges. Each wedge comprises left and right conductive surfaces (15, 16) that are bonded to and separated by an electrically insulative center core 17.

An important thing to notice about FIG. 3 is where on the legs 9 the wedges 8 make mechanical and electrical contact; i.e., where on the legs the wedging occurs. As can be seen in both FIGS. 2 and 3, it occurs at a location 18 on the legs 9 proximate where they emerge from the case or body of the IC 7. The legs are widest at that point (or at least no narrower than anywhere else), and since location 18 is "furthest up" on the legs, the greatest interdigitating penetration of the wedges 8 with the legs 9 is with respect to that location. (Hence the wedges are wider there, as compared to closer to the tip of the wedges.)

Figure 4A:
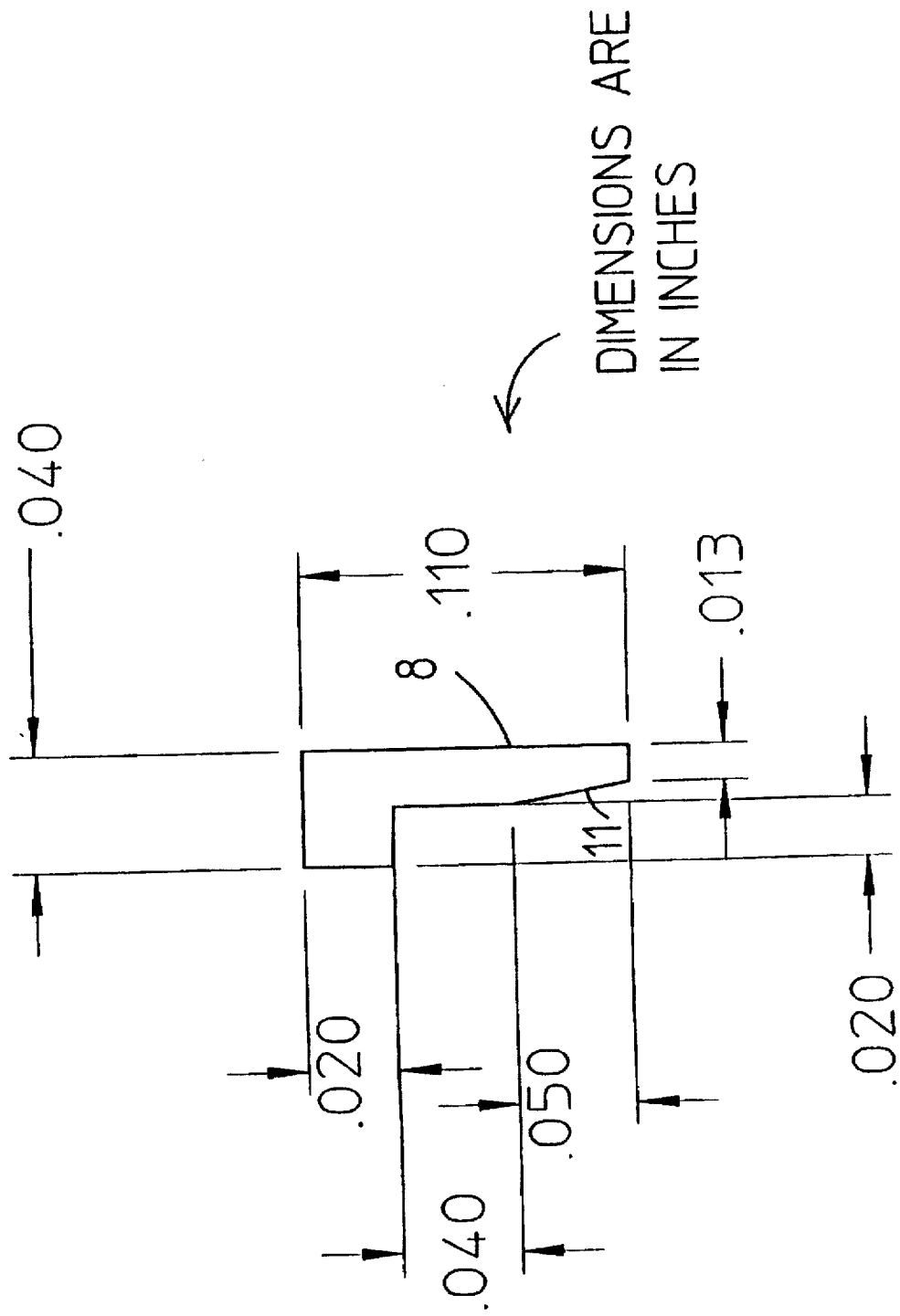
FIG. 4A is an enlarged and dimensioned view of an individual wedge excerpted from FIG. 2 and shown in isolation.

FIGS. 4A and 4B are enlarged excerpts of the material depicted in FIGS. 2 and 3. FIG. 4A is an enlarged side view of an individual wedge 8 shown in isolation. FIG. 4B an enlarged view of some wedges 8 in wedged interdigitation with some legs 9. The location 18 of mechanical and electrical contact between the wedges 8 and legs 9 during wedging is clearly visible. In addition, both figures are dimensioned to show the size of the parts. Dimensions are given in inches and assume that the center-to-center spacing of the IC legs is 0.0197 inches.

At this point the reader will have no difficulty in appreciating the basic concept behind a probe for IC's or the like with contacts that interdigitate with and wedge between adjacent legs of the IC. We now turn our attention to how to make such a thing.

Figure 5:
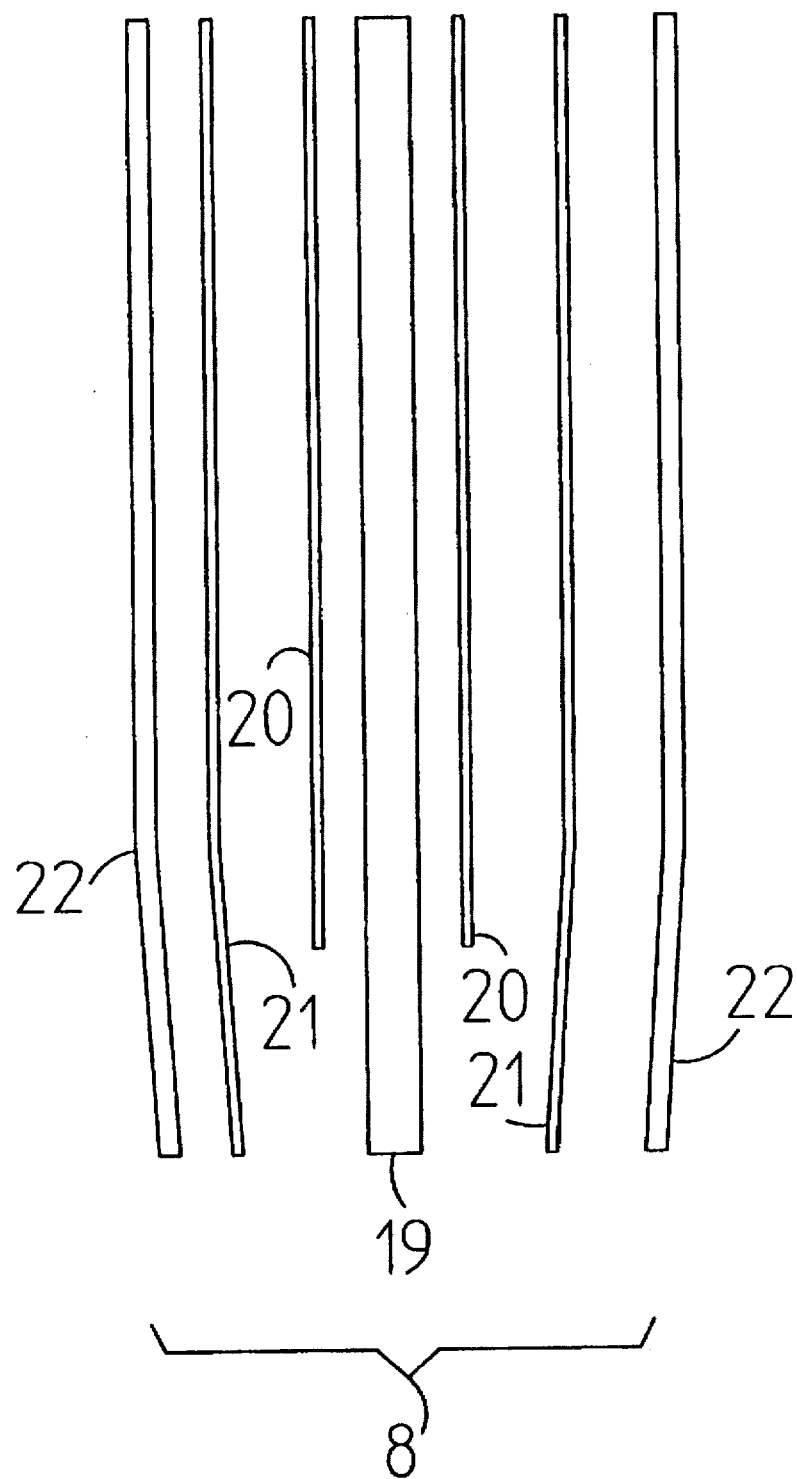
FIG. 5 is an exploded end-on view of a tapered wedge of FIG. 3.

Consider the exploded end-on view of a wedge 8 shown in FIG. 5. The outer conductive surfaces of the wedge 8 are formed of pieces 22 of beryllium copper 0.002" in thickness. These pieces 22 of beryllium copper have previously been plated with twenty to thirty micro inches of nickel followed by thirty to fifty micro inches of gold. In principle, only the surfaces that are to be the outer surfaces of the wedges need be so plated, although as a practical matter it may be easiest to plate the pieces 22 on both sides. Within the outer conductive surface pieces 22 are alternating layers (21, 19 and 21) of adhesive 21 and filler material 20. Adhesive layer 21 is preferably a thermoset adhesive. By the term "thermoset adhesive" is meant a material which becomes sticky and plastic when sufficiently hot, and that when cooled becomes rigid, strong and bonded to surfaces that were placed in contact therewith while in the plastic state. The adhesive may be of varying thickness to assist in achieving wedges of a desired thickness; in the preferred embodiment for an IC having a center-to-center lead spacing 0.0197" with an interlead gap of 0.011", layers 21 are each 0.001" thick and layer 19 is 0.003" thick. The adhesive may be type WA acrylic adhesive, which is available from DuPont. The filler material adds both bulk and rigidity, and may also be of a thickness chosen in partial determination of those properties. The filler material may, for example, be Kapton, which is also a registered trademark of DuPont and which pertains to flexible plastic material often used in the manufacture of so-called flexible printed circuit boards. In brief, the layers 19–22 are registered and then bonded under heat and pressure.

The wedge 8 can be given a tapered end by making one or more of the layers have different lengths. For example, in FIG. 5 layers 20 are shown as shorter than the other layers. This results in the thickness at the tip of the wedge 8 being the cumulative thickness produced by layers 19, 21 and 22, while further up the wedge's thickness is increased by the additional thickness of layers 20. If desired, layer 19 can also be made shorter as a way of tapering the tip of the wedge 8.

Now, as can be seen from the typical dimensions in FIGS. 4A and 4B, an individual wedge for a surface mount part is a relatively small thing; comparable in size to a large black ant. And while in theory it would be possible to assemble such individual wedges one at a time, and then assemble them into a spaced array, such an approach is probably not the most practical one.

Figure 6:
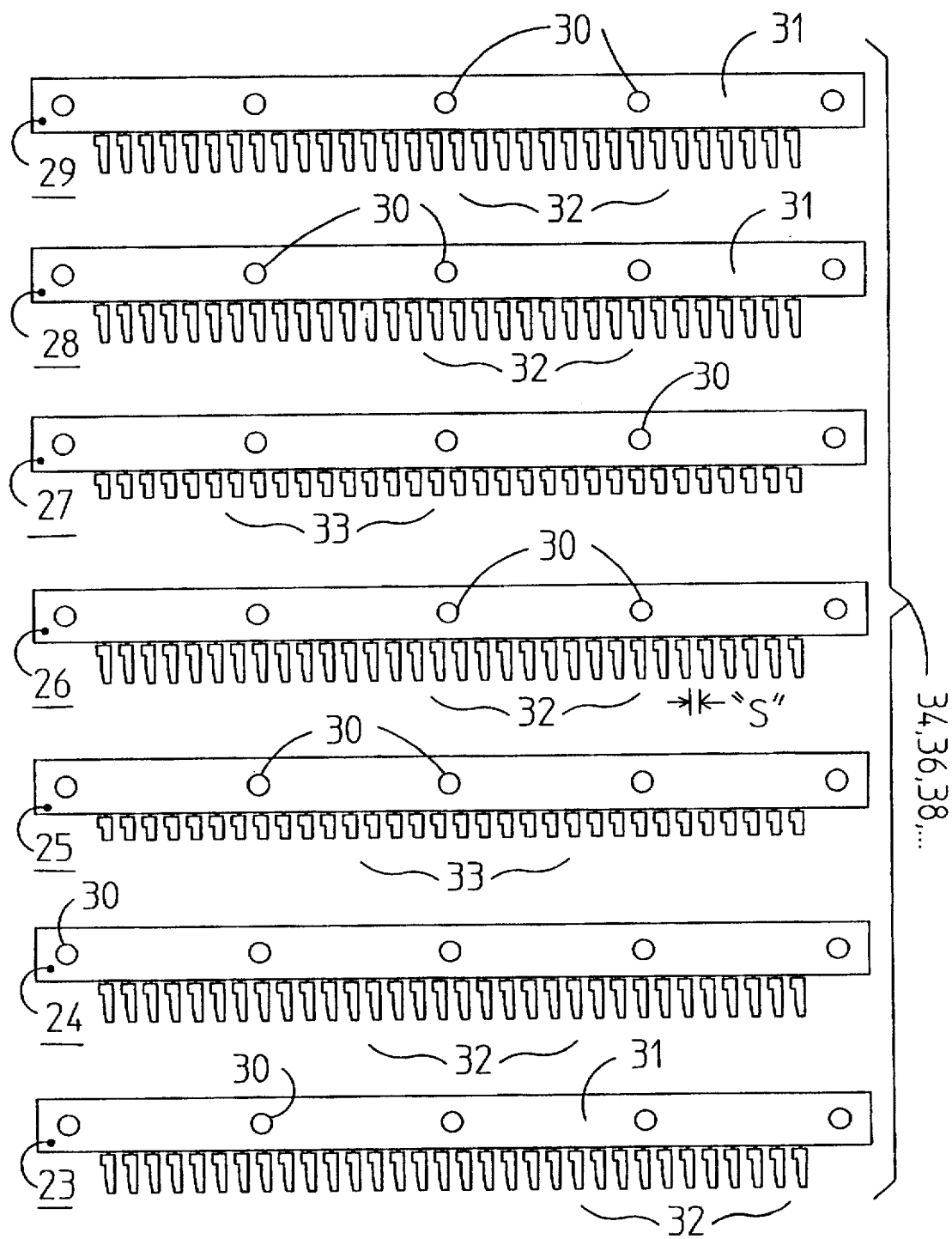
FIG. 6 is a plan view of a number of layers of shaped component material to be stacked and laminated together to form a stick of wedges.

A preferred way of making wedges and spacing them apart is described in connection with FIGS. 6–8. Referring now to FIG. 6, observe the seven strips of material 23–29. These strips are shown larger than they actually are, and each represents a different layer of material that goes into a wedge 8. Each strip has thirty-one leg-parts 32/33 attached to or descending from a header or carrier strip 31. Strips 23 and 29 are of BeCu plated with Au and Ni, and will form the outer conductive surfaces of collection of wedges. Strips 24 and 28 are layers of adhesive, while strips 25 and 27 layers of Kapton. Leg-parts 33 of strips 25 and 27 are shorter than the leg-parts 32 of the other strips. This is, as discussed earlier, what gives the wedges a tapered tip. Finally, strip 26 is a layer of adhesive that forms the central core of a wedge 8. Each of these strips 23–29 is of an appropriate thickness, as discussed earlier.

Layers 23–29 are seen in FIG. 6 as though they were actually laid out on a sheet of paper for inspection, as indeed they actually could be. To assemble the layers, however, layer 24 is placed on top of, with exact registration, layer 23. Then layer 25 is placed on top, followed by layer 26, and so on, until the final top layer 29 is placed on top. A jig (not shown) is of considerable assistance in this activity. The jig includes a flat base from which rise five registration pins whose size and spacing match exactly the five registration holes 30 in each of the strips 23–29. To stack the strips 23–29 they are simply placed, in order, over the registration pins of the jig, so that the pins pass through the holes 30. Following that, the layers, while still on the jig, are heated and compressed to the particular desired thickness. The result is a collection of laminated coplanar wedges, which we shall refer to as a "stick" of wedges.

Note that the individual wedges in a stick are spaced some convenient distance apart, as indicated by the symbol "S". Exactly what the distance "S" is mostly a matter of choice, provided that the distance is at least some minimum amount. As will shortly become clear, sufficient space may be required for a saw kerf between the wedges.

Figure 7:
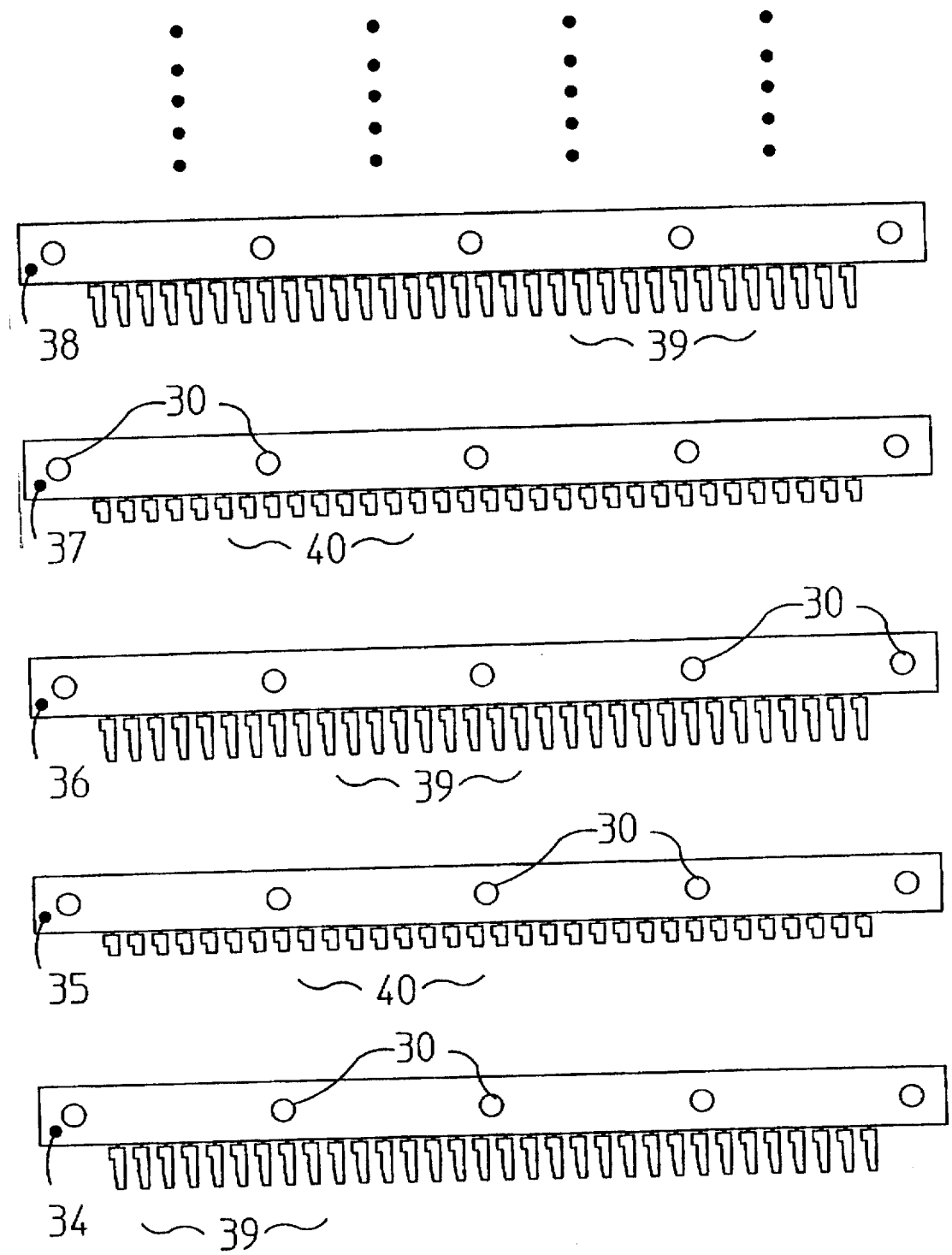
FIG. 7 is a plan view of a number of sticks of FIG. 6, interspersed with spacers, to be laminated together to form a stack of sticks.

An individual stick of wedges won't do us much good, but if we laminate (as we did for FIG. 6) alternating layers of sticks (34, 36, 38) and adhesive (35, 37), as shown in FIG. 7, the result is a stack of sticks. A stack includes as many sticks (34, 36, 38) as there are to be individual wedges 2 on a side of a probe 1. The number of layers of adhesive (35, 37) is one less than the number of sticks. Note that the length of the adhesive spacers 40 in layers 35 and 37 is less than the length of the wedges 39 of sticks 34, 36 and 38. This length difference is necessary to avoid interference with the legs of the IC when the probe is installed thereon. The same or a similar jig could be used for this process of making stacks as is used for making sticks of wedges, although that would appear to have the disadvantage of making one stick at a time. A more efficient preferred way of making sticks of wedges and subsequently laminating them into stacks is described next.

Sticks of wedges needn't be made one stick at a time, as outlined above. Referring again to FIG. 5, strips 23 and 29 of plated BeCu are shown as individual items. Consider a large number of these, say ten or twelve, all lying in the same plane and arranged as a column within the plane (much as the seven strips 23–29 are arranged in FIG. 5). Let these strips all be from the same sheet of BeCu, and let then still be connected to a remaining outer rectangular border of the sheet. This border contains additional registration holes, say, at each corner and at various places along the border. The pattern of the leg-parts comprising the strips could in principle be obtained by a punching operation with a die, but a more practical method is to produce the pattern by etching. The Ni/Au plating may applied after the etching.

The subsequent layers of strips 24–28 (refer to FIG. 5) may be entire sheets or individual strips, as is convenient. Either way, consider a registration press fixture having two parallel cap pieces with a generous number of dowel rod registration pins in the bottom cap piece and corresponding close fitting holes in the top cap piece. The idea is to load the interior of the fixture between the two cap pieces with the assorted strips, relying on the dowel rods to maintain registration of the strips during a heat and compression cycle.

The interior surface of each cap piece carries a teflon blanket that serves as a release agent and as a slightly compliant surface that both distributes the force of compression and discourages migration of the strips when they are under pressure. To load the fixture a sheet of shim strips is first placed on top of the teflon blanket of the bottom cap piece. The shim strips are simply long strips of sheet 0.002" thick stainless steel running between an outer frame having the same pattern of peripheral registration holes as the sheet of etched wedge parts. The long strips of stainless steel traverse the region to be occupied by the tips of the wedges, and do not overlap portions of wedges that are to be untappered. There is one shim strip for each strip 23 in the sheet of strips. After the shim strips are registered, the sheet of strips 23 is registered above it, followed by layers of material containing strips 24–28, in order. Next, another sheet of strips 23 is registered, followed by another set of shim strips identical to the one already used. Last, the top cap piece with its teflon blanket is registered.

The purpose of the shim pieces is to impart the tapered tips to the wedges, in cooperation with the different lengths of material used inside the wedges, as previously described. The shims assist in this by reducing the interior clearance in the registration fixture in those areas adjacent the tips of the wedges.

It may be desirable to equip the registration fixture with some stops or other mechanical interference mechanism to control the degree to which the interior surfaces of the cap pieces are allowed to approach each other when pressure is applied. This is useful in controlling the finished thickness of the sticks of wedges.

One or more temperature sensors may be located in either or both of the cap pieces to assist in process control.

For the materials and registration fixture described herein the collection of sticks is laminated at a temperature of 385 degrees Fahrenheit for one hour under a pressure of 250 PSI. It is then cooled under pressure for twenty minutes or until the indicated temperature is under 100 degrees F. Once the parts have cooled an entire sheet of sticks is then removed from the fixture. The sticks are cut away from the frame, and are then ready for further processing.

For an actual probe to be used on an IC having twenty-five legs on a side, a stack of twenty-six sticks with twenty-five intervening layers of adhesive/spacer is laminated in a fixture having registration pins and a mechanical stop to control the finished height of the stack. No teflon blanket is used. The lamination cycle is:

1. Close the preheated press on the loaded fixture and apply 625 PSI for one minute.

2. Let the pressure fall to zero PSI without opening the press, and allow the fixture to heat to 275 degrees Fahrenheit.

3. Apply 625 PSI and increase temperature to 375 degrees F. for one hour.

4. Cool under pressure until the temperature of the fixture is under 100 degrees F.

After the stack of sticks is removed it is checked for overall height, which implies a particular wedge-to-wedge spacing.

Figure 8:
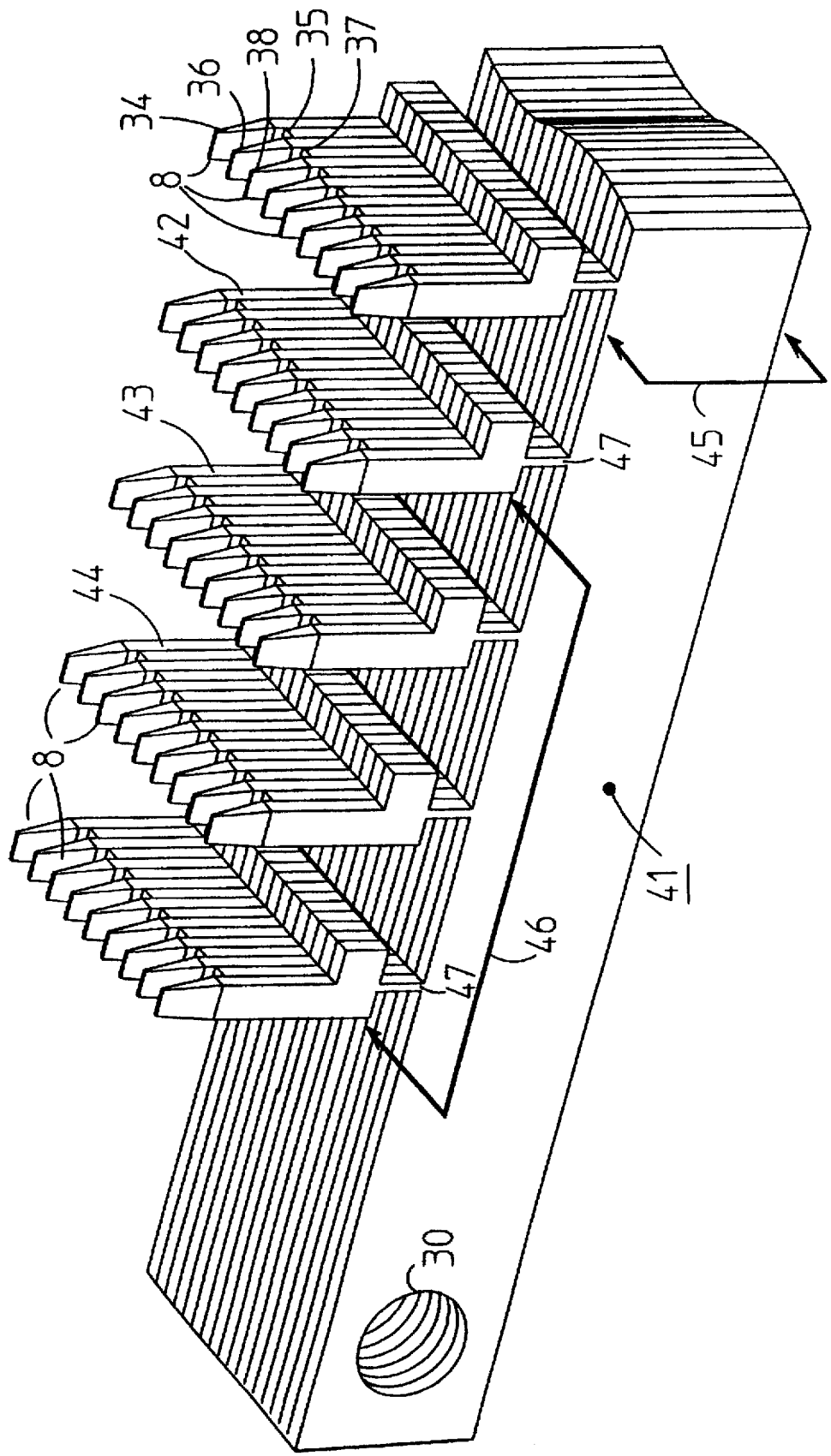
FIG. 8 is a perspective view of a stack of sticks after the lamination associated with FIG. 7.

A portion of a stack 41 of nine sticks (34, 36, 38) is illustrated in FIG. 8. Observe the separation between wedges 8 that is produced by the layers (35, 37) of adhesive having legs of reduced length. For clarity of illustration the stack 41 is shown as having only nine sticks. While this is certainly possible, it should be borne in mind that most high density IC's have many more legs per side than the eight legs that nine sticks would correspond to. Parts with as many as twenty-six sticks have been successfully produced for use with IC's having one hundred legs. Also, the proportions of the parts shown in FIG. 8 have been altered slightly to aid in an uncluttered depiction.

Once a stack 41 of sticks is in hand, individual rows (42, 43, 44, . . . ) of wedges can be produced as follows. The stack 41 is placed, wedge tips down, upon a heated plate. The plate can either have a recessed portion into which the stack is placed, or a dam may be built around the stack with pieces of suitable material, e.g., glass blocks. Next, hot wax is poured over the inverted stack 41, and allowed to cool and cure. This anchors the stick 41 to the plate. Then the plate is mounted on the table of a diamond wheel lapping machine. As seen in FIG. 8, the portion of the stick 41 which is below the plane of arrow 46 is ground or lapped away through the wax (the stack is upside down on the table, remember). The lapping also removes the riser portions 47, as well. Afterwards, the individual rows of wedges (42, 43 and 44) can be recovered by re-melting the wax and collecting the rows. The recovered rows of wedges are then cleaned by first wicking away the excess wax while under heat, followed by an ultrasonic cleaning in a suitable solvent, such as perchlorethylene.

Other procedures are certainly possible. For example, it may be desirable to saw off one row at a time by instead sawing with the kerf in the plane of the arrow 45. If this is done, then a second operation is needed on each row produced, to sever the riser portion 47. Furthermore, the space between adjacent wedges along their header may become an issue (i.e., room for a saw kerf), depending upon from which side of the stack (the "top" wedge side or the "bottom" underside) the saw blade enters the material, and how far through the parted material the edge of the blade extends.

Figure 9:
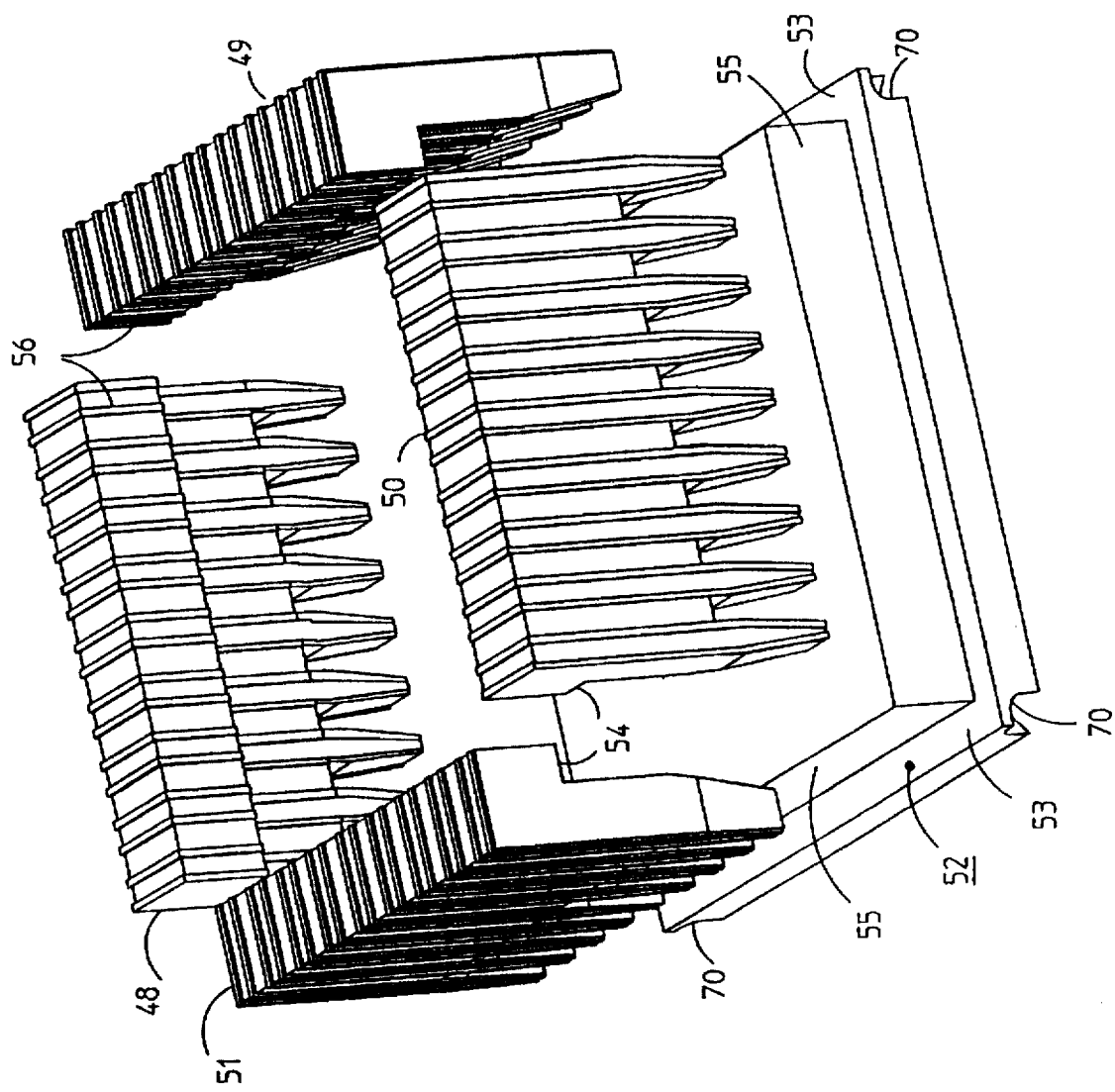
FIG. 9 is a perspective view of rows of wedges exploded away from a mantle that carries the rows of wedges.

Referring now to FIG. 9, four rows 48, 49, 50 and 51 of wedges are shown disposed above a mantle 52. A shelf 53 and wall 55 in the upper side of the mantle 52 are sized to engage corresponding tabs 54 in the underside of the rows 48–51. The mantle 52 may be of FR4 (a glass epoxy material used as a substrate for printed circuit boards), of ceramic, or of any suitable plastic. What is required of the mantle material is insulation, strength and compatibility with an adhesive suitable for use with the rows of wedges. What is done is to coat the shelf 53 and wall 55 with adhesive (e.g., epoxy) and then register rows 48–51 into position. When the adhesive has set we now have the assembly 57 of wedges or tapered fingers shown in FIG. 10. Alternatively, the mantle 52 may comprise a lower section whose top surface is shelf 53 and a separate upper section whose sides are wall 55. This arrangement may be advantageous if it is desired to temporarily adhere the rows to the lower section while all are sitting on a flat plate. Any needed adjustments can then be made before the upper section is then glued to both the lower section and all the rows.

At this point the top butt ends of the wedges (the ends furthest from the tapered tips) are wet lapped with 3M wet or dry paper (431Q) to remove any unevenness and ensure that the edges of the conductive surfaces are exposed and clean. This lapping has been observed to stretch or peen the end surface of the beryllium copper, so that the lapped butt end of each wedge presents a thicker cross section of copper than it has elsewhere along the wedge. This is a beneficial result that increases the surface area available for electrical interconnection to the wedges in the row. After this final lapping the wedge assembly 57 is placed onto an electrical test fixture that physically resembles an integrated circuit. A continuity check is performed on each wedge. A check for shorts can be performed, as well.

Figure 10:
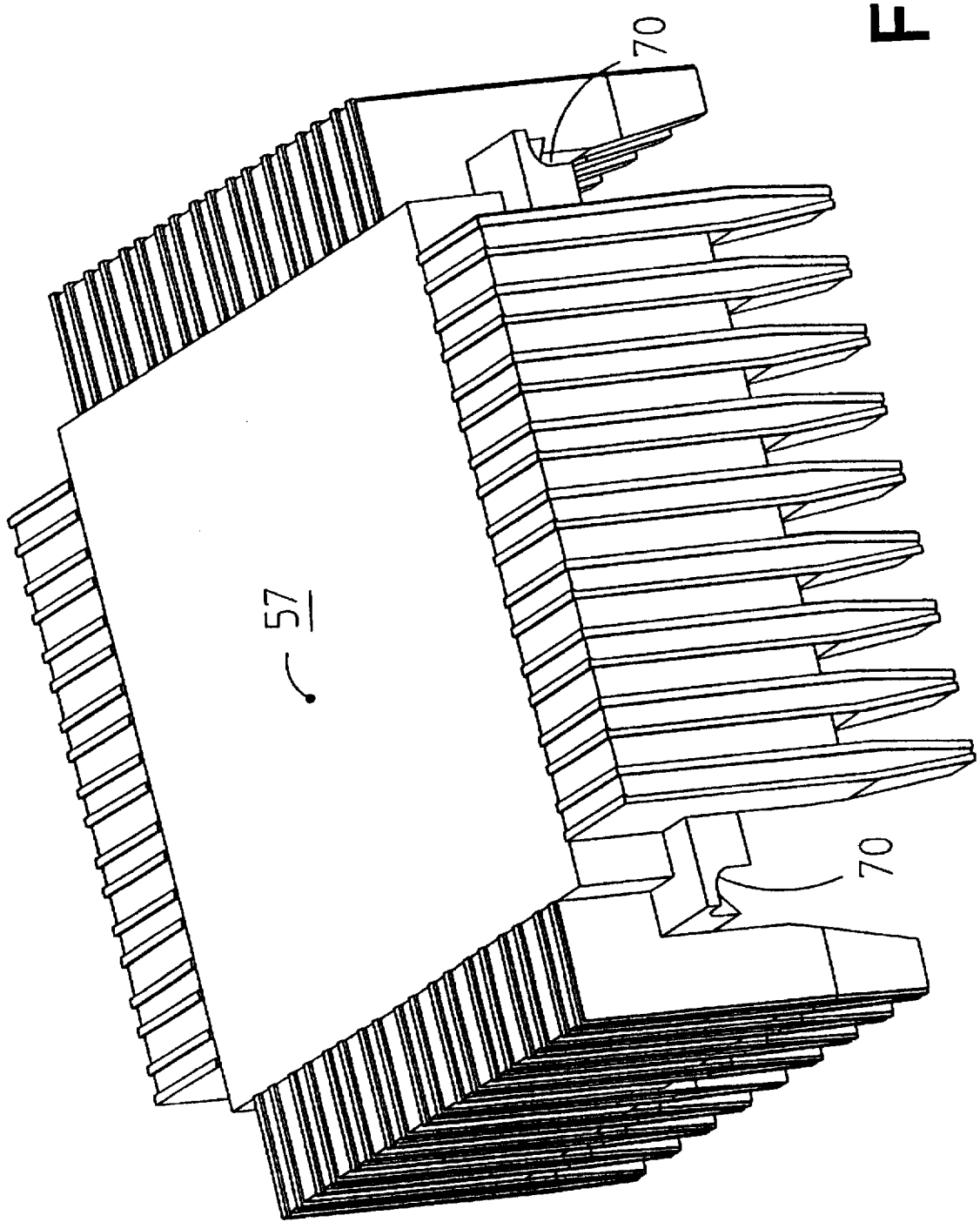
FIG. 10 is a perspective view of rows of installed wedges being carried by the mantle of FIG. 9.

FIG. 10 illustrates a structure or assembly 57 of wedges or tapered fingers for probing an IC (not shown in this figure) or the like. Wedge structure 57 may be positioned over the IC, then affixed thereto and subsequently held thereon by the action of the wedges (tapered fingers) as they compress (are wedged) between the adjacent legs of the IC. Since the outer surface of each wedge is conductive, and since there is one more wedge per side than legs, each leg of the IC is straddled by a pair of adjacent wedges. Thus, each leg is in electrical contact with a pair of wedge outer surfaces at a respective pair of locations on the leg. Now what is needed is a way to electrically connect the outer surfaces of the wedges to the measurement or stimulus equipment (test equipment).

Figure 11:
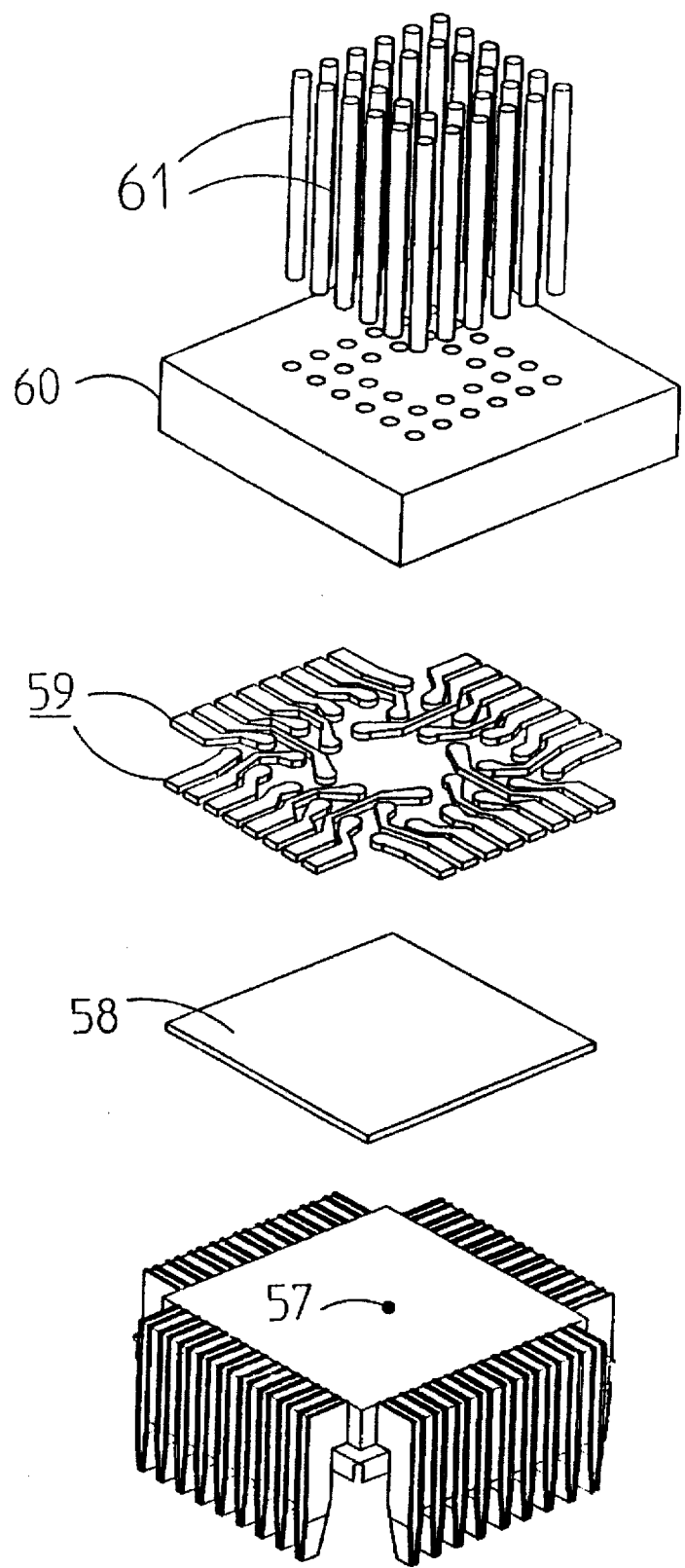
FIG. 11 is an exploded view of a wedge assembly, a lead frame and a pin block used in the fabrication of the probe of FIG. 1.

FIG. 11 illustrates a preferred way of electrically connecting to the conductive surfaces of the rows 48–51 of wedges in wedge structure 57. A pin block 60 receives a plurality of pins 61; there is at least one pin 61 for each pin (leg) on the IC (not shown) and there is one hole passing all the way through the pin block 60 for each pin 61. A Kapton and beryllium copper lead frame 59 (think: "flexible printed circuit board") is placed below pin block 60. The underside of pin block 66 abuts the top of lead frame 59, and the lower ends of pins 61 pass all the way through their respective holes in pin block 60 until they each penetrate a hole in a corresponding interior pad of lead frame 59. The pins 61 are then soldered to the interior pads of the lead frame 59.

The lead frame 59 has a pattern of outer lands around its periphery. The position and width of these outer lands is such that when the lead frame 59 is registered over assembly 57 each land (except the ones at the corners) is directly above a corresponding pair of facing electrically conductive surfaces formed of two consecutive wedges in the row thereof. The arrangement of interior pads is connected to the outer lands by a pattern of traces. Each interior pad is directly under one of the pins 61 when the pin block 60 is registered over the parts (59, 57) below it. The lead frame 59 thus accomplishes and determines the correspondence between the legs of the IC and the pins 61.

The outer lands of the lead frame 59 are soldered to the exposed butt ends of the wedges of assembly 57. A layer of adhesive 58 between the wedge assembly 57 and lead frame 59 helps keep the whole probe together, as does a bead of epoxy (not shown) applied around the joint between the lower side of the pin block 60 and the top of the wedge assembly 57.

Figure 12:
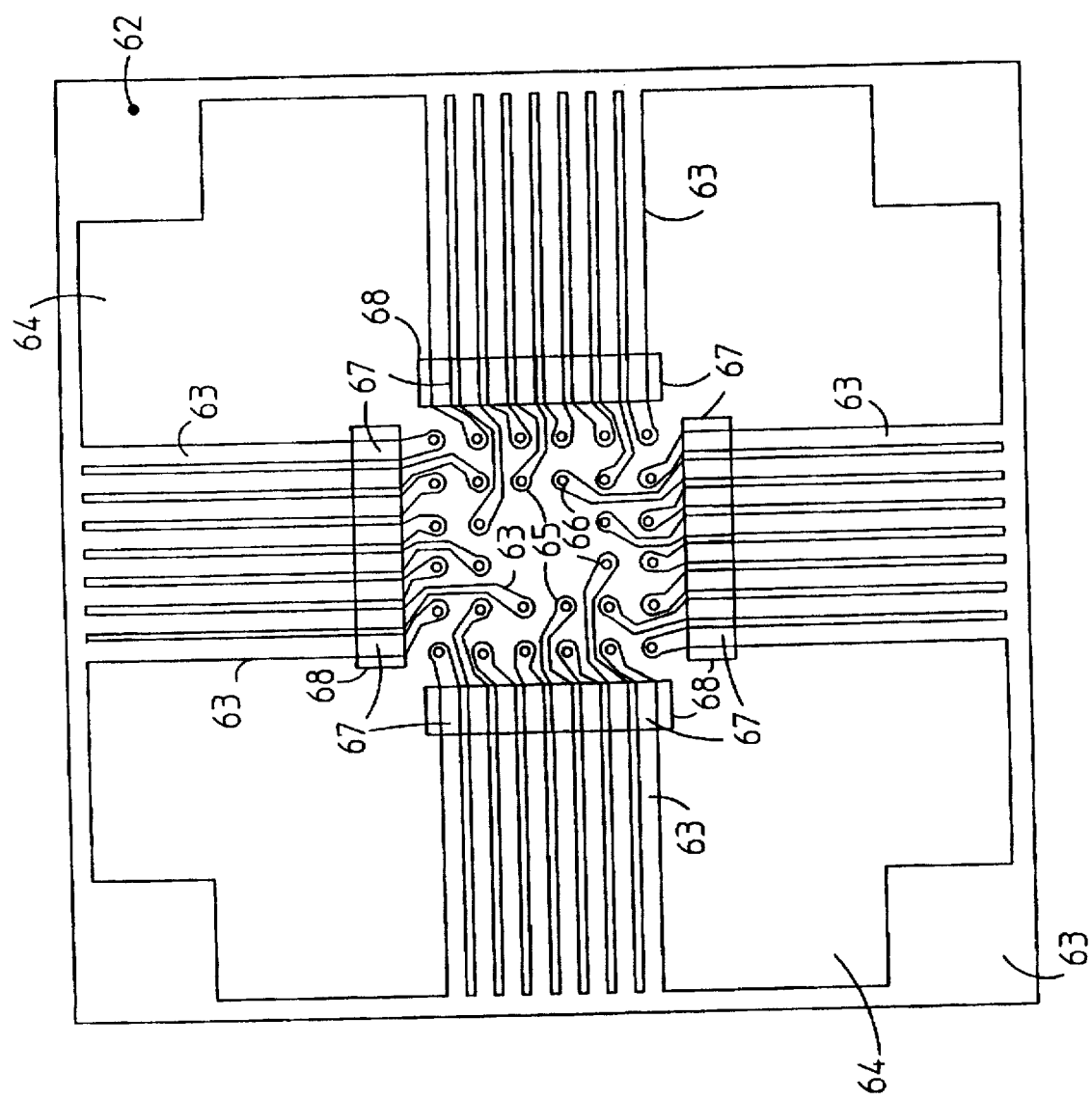
FIG. 12 is a plan view of the lead frame of FIG. 11.

FIG. 11 is generally effective in conveying what's in the completed probe assembly. Refer to FIG. 12 during the following discussion of certain additional details concerning the steps used to actually assemble the wedge assembly 57 to the pin block 60. FIG. 12 is a plan view of an unused lead frame 62 corresponding to lead frame 59 of FIG. 11. Lead frame 62 of FIG. 12 is a small flexible printed circuit. That is, it has etched BeCu traces 63 that are carried upon a sheet of Kapton 64. Note the interior pads 65; each such pad 65 includes a hole 66 therein for receiving a pin 61. Note how the pattern of traces 63 proceeds from the interior pads 65 to trace portions 67 that are the outer lands. The four rectangular regions 68 denote areas where all of the Kapton surrounding the outer lands 67 has been removed, and the BeCu traces there (the outer lands 67) cleaned in preparation for soldering.

First, lead frame 62 is aligned with the pins 61 of the pin block 60, and the pins 61 pressed through the holes 66 until the lead frame 62 is in uniform close contact with the underside of the pin block 60. The pins 61 are then soldered to the interior pads 65. The solder joints may then be sanded flat with 240 grit sand paper. At this point a continuity check may be performed from the BeCu of the lead frame 62 to each pin 61.

Now the bulk of the peripheral portion of lead frame 62 outwards of regions 68 may be trimmed away, if desired. A small mount of fast setting epoxy is applied to the center of the top of wedge assembly 57 (this is adhesive 58 of FIG. 11). Regions 67 with their outer lands 67 are aligned over the butt ends of the wedges using an alignment fixture and a 10× microscope. The pin block 60 and wedge assembly 57 are then pressed together and held in place until the epoxy sets up. Now the outer lands 67 are hot air soldered to the butt ends of the wedges, and the excess length of the outer lands 67 trimmed off flush with the sides of wedge assembly 57.

At this point the entire assembly may be given a rigorous final electrical test, after which the joint between the pin block 60 and the wedge assembly 57 is filled with a bead 69 of epoxy (see FIGS. 1–3). This seals the probe's most delicate solder joints against the environment, mechanically protects them and adds to the overall mechanical integrity of the probe. To ensure the epoxy is fully cured the finished probe may be baked in an oven at 150 deg. F. for two hours.

Now all that remains is to attach to the pins 61 the desired conductors, cabling, flexible printed circuit board, socket, etc., connecting the probe to the test equipment. A preferred way of accomplishing this is to solder to the tops of pins 61 a small multi-layer flexible printed circuit board (not shown) having an array of plated-through holes matching pins 61. Traces starting from those holes travel generally parallel for a distance of, say, three inches, and end in a distal array of plated-through holes which receive a connector for mating with another connector attached to a cable leading to the test equipment. The short length of flex circuit board serves to mechanically decouple the probe 1 (when installed on an IC) from the relatively stiff cable leading to the test equipment.

When in use a completed probe is installed onto an IC by simply pushing it on until it won't go any further. In the case of a probe such as the ones shown that have wedges on all four sides of a rectangular package, installation is generally self-aligning, since incorrect positioning results in non-symmetrical contact of the wedge tips and the IC, causing a detectable tilting of the probe relative to the top surface of the IC. Only when the probe is correctly aligned will it be untilted when in mechanical contact with the IC.

Once the probe 1 is installed it is held in place simply by the friction between the legs of the IC and the wedges; for a one hundred pin IC that force can be considerable. It might not be advisable to pull on the body of the probe, or attempt to rock it from above, as part of the removal process. To do so could unduly stress the mechanical bonds in the probe, and perhaps even risk bending some of the wedges. To aid in probe removal the underside of mantle 52 (refer to FIG. 9) carries an X-shaped groove 70, which runs diagonally between the four corners. The groove 70 (see also FIGS. 1–3) is large enough to receive the end of a straightened paper clip (or similar wire or tool). This device allows a gentle prying action to loosen the probe 1 from the IC.

Various alternate embodiments will be understood to lie within the scope of the present invention. The spacer between the wedges need not be an insulator adhered to adjacent wedges by an adhesive. It could instead be of a conductive material, say, copper, and could be soldered to its adjacent wedges. Wedges might be conductive only on one side. And a material known as Z-axis laminate could be used to make electrical contact, and provide mechanical adhesion, between elements within the probe.

Z-axis laminate is a thin sheet of adhesive plastic material in which has been embedded a generally uniform distribution of small solder balls. Upon the application of heat and pressure the solder balls will melt and adhere to solderable material on or abutting each surface of the sheet of Z-axis laminate. While some small adjacent solder balls may coalase to form larger balls, this effect does not extend to forming short circuits between adjacent conductors (i.e., the butt ends of the conductive surfaces of the wedges or the traces of the lead frame 59). The many tiny balls of solder act as "pop-throughs" which inter-connect directly opposing solderable surfaces. It will be appreciated, then, that the lead frame 59 shown in FIG. 11 could be connected to the wedge assembly 57 below and/or the pins 61 above by (a) sheet(s) of intervening Z-axis laminate. The pieces of the probe are compressed and heated; the butt ends of the conductive surfaces of the wedges are electrically connected by soldering to the underside of the outer lands of the lead frame 59, and thence by soldering from the top of the interior pads of the lead frame 59 to the undersides of the pins 61.

Finally, it will be understood that it is possible to include either passive or active circuitry within the probe assembly. Such circuitry could be a hybrid on a substrate or on a circuit board that either replaces or simply augments the lead frame 59. The purpose of the circuitry could range from simply buffering signals to be measured for impedance/loading considerations, to actual signal/information processing.

I claim:

1. A method of electrically connecting test equipment to each of a plurality of n adjacent pins of an electronic component, n being at least three, the method comprising the steps of:

wedging the n adjacent pins into n spaces between n+1 adjacent tapered fingers, each tapered finger having first and second electrically conductive surfaces separated by an insulator;

electrically connecting the second electrically conductive surface of a tapered finger with the first electrically conductive surface of an adjacent tapered finger, these second and first electrically conductive surfaces facing each other and being on opposing sides of an intervening pin of the plurality of n pins; and electrically coupling each of the facing second and first electrically conductive surfaces to test equipment.

2. A method of electrically connecting test equipment to each of a plurality of n adjacent pins of an electronic component, the method comprising the steps of:

wedging n−1 adjacent tapered fingers into the n−1 spaces between the n adjacent pins, each tapered finger having first and second electrically conductive surfaces separated by an insulator;

electrically connecting the second electrically conductive surface of a tapered finger with the first electrically conductive surface of an adjacent tapered finger, these second and first electrically conductive surfaces facing each other and being on opposing sides of an intervening pin of the plurality of n pins;

electrically coupling each of the facing second and first electrically conductive surfaces to test equipment; and electrically connecting to the test equipment the first electrically conductive surface of a first tapered finger at one end of the n−1 adjacent tapered fingers and also the second electrically conductive surface of a last tapered finger at another end of the n−1 adjacent tapered fingers.

3. A method of electrically connecting test equipment to each of a plurality of n adjacent pins of an electronic component, the method comprising the steps of:

wedging a group of n−1 adjacent tapered fingers, interior to a plurality of n+1 adjacent tapered fingers, into the n−1 spaces between the n adjacent pins, each tapered finger having first and second electrically conductive surfaces separated by an insulator;

electrically connecting the second electrically conductive surface of a tapered finger with the first electrically conductive surface of an adjacent tapered finger, these second and first electrically conductive surfaces facing each other and being on opposing sides of an intervening pin of the plurality of n pins; and electrically coupling each of the facing second and first electrically conductive surfaces to test equipment.

4. A method of electrically connecting test equipment to the legs of an integrated circuit, the method comprising the steps of:

wedging first and second electrically conductive surfaces separated by an insulator between adjacent legs on the same side of an integrated circuit;

electrically connecting respective first and second conductors to each of the first and second electrically conductive surfaces; and electrically coupling the first and second conductors to test equipment.

5. A method of electrically connecting test equipment to adjacent electrical leads physically supporting an electronic component, the method comprising the steps of:

wedging first and second electrically conductive surfaces separated by an insulator between adjacent electrical leads of an electronic component that is physically supported by those adjacent electrical leads;

electrically connecting respective first and second conductors to each of the first and second electrically conductive surfaces;

electrically coupling the first and second conductors to circuitry proximate the first and second electrically conductive surfaces; and electrically coupling the circuitry to test equipment.

6. A method of electrically connecting test equipment to each of a plurality of n adjacent pins of an electronic component, the method comprising the steps of:

wedging the n adjacent pins into n spaces between n+1 adjacent tapered fingers, each tapered finger having first and second electrically conductive surfaces separated by an insulator;

electrically connecting the second electrically conductive surface of a tapered finger with the first electrically conductive surface of an adjacent tapered finger, these second and first electrically conductive surfaces facing each other and being on opposing sides of an intervening pin of the plurality of n pins;

electrically coupling each of the facing second and first electrically conductive surfaces to circuitry proximate the tapered fingers; and electrically coupling the circuitry to test equipment.

7. A method of electrically connecting test equipment to the legs of an integrated circuit, the method comprising the steps of:

wedging first and second electrically conductive surfaces separated by an insulator between adjacent legs on the same side of an integrated circuit;

electrically connecting respective first and second conductors to each of the first and second electrically conductive surfaces;

electrically coupling the first and second conductors to circuitry proximate the first and second electrically conductive surfaces; and electrically coupling the circuitry to test equipment.

\* \* \* \* \*